United States Patent [19]

Kwon et al.

[11] Patent Number: 5,594,275
[45] Date of Patent: Jan. 14, 1997

[54] J-LEADED SEMICONDUCTOR PACKAGE HAVING A PLURALITY OF STACKED BALL GRID ARRAY PACKAGES

[75] Inventors: Young S. Kwon, Inchon-jikal; Seung H. Ahn, Suwon, both of Rep. of Korea

[73] Assignee: Samsung Electronics Co., Ltd., Suwon, Rep. of Korea

[21] Appl. No.: 345,385

[22] Filed: Nov. 18, 1994

[30]     Foreign Application Priority Data

Nov. 18, 1993 [KR] Rep. of Korea ...................... 93-24581

[51] Int. Cl.$^6$ ........................... H01L 23/02; H01L 23/48; H01L 23/82
[52] U.S. Cl. .......................... 257/686; 257/685; 257/696; 257/738
[58] Field of Search ..................................... 257/679, 686, 257/690, 697, 698, 701, 702, 737, 738, 762, 774, 777, 798, 696, 685

[56]             References Cited

FOREIGN PATENT DOCUMENTS 2-134859   5/1990   Japan ..................................... 257/686

OTHER PUBLICATIONS

"Pad Array Improves Density", Electronic Packaging & Production edited by Howard Markstein, May 1992.
Article re Over Molded Pad Array and Carrier, ASIC & EDA, pp. 9–15 (Mar. 1993).

*Primary Examiner*—Carl Whitehead, Jr.
*Attorney, Agent, or Firm*—Cushman Darby & Cushman IP Group of Pillsbury Madison & Sutro LLP

[57]             ABSTRACT

A semiconductor device having at least one semiconductor chip loaded on a lower surface of a printed circuit board, electrode terminals of the semiconductor chip wire-bonded to terminals on the printed circuit board, and a connection portion of the semiconductor chip and wires encapsulated by means of encapsulating resin includes a semiconductor device of three-dimensional structure having the printed circuit board reversely mounted, the terminals of the printed circuit board connected to external terminals via through holes, and at least one semiconductor device stacked on an upper surface of the printed circuit board, thereby interconnecting respective semiconductor devices while interposing solder balls to be mounted to other printed circuit boards by leads being the external terminals. Thus, a ball grid array (BGA) package able to be stacked inside a small out-line J-lead (SOJ) package is used for performing interconnection to make the BGA overcome a typically two-dimensional flat mounting and attain a three-dimensional surface mounting structure while being perfectly compatible with a currently-available mounting process on the main substrate, thereby improving mounting efficiency.

10 Claims, 3 Drawing Sheets

5,594,275

J-LEADED SEMICONDUCTOR PACKAGE HAVING A PLURALITY OF STACKED BALL GRID ARRAY PACKAGES

BACKGROUND OF THE INVENTION

1. Field of the Invention

The present invention relates to a ball grid array (hereinafter referred to as "BGA") package, and more particularly, to a semiconductor device for a memory module for high density mounting by forming through holes in the upper portion of a semiconductor substrate and forming solder balls on the lower portion of the semiconductor substrate. A method for manufacturing the semiconductor device is also provided.

2. Description of Related Art

The desire for high performance and multifunction in electronic apparatuses has been heightened along with the continuing trend towards smaller and thinner dimensions. Various semiconductor device mounting methods are in demand for efficiently mounting large capacity memory devices within a limited internal space.

As one method for achieving the above objectives, an Over Molded Pad Array Carrier (OMPAC) package of Motorola is disclosed in ASIC & EDA, pp. 9–15, March 1993, and may be taken as an example.

FIG. 1 is a vertical sectional view showing an example of the conventional semiconductor device.

Referring to FIG. 1, the semiconductor device includes a sub-substrate 11 having through holes 15 spaced by a predetermined interval, and conductive contact pads 13 formed on predetermined regions of the sub-substrate 11. Additionally, a semiconductor chip 12 is mounted on the subsubstrate 11 by means of an insulating adhesive, for example. A wire 14 electrically connects a bonding pad of the semiconductor chip 12 to the conductive contact pad 13, and the wires 14 and the semiconductor chip 12 are molded with epoxy molding compound (hereinafter referred to as "EMC") to form a package body 10. Solder bump electrodes, (i.e., solder balls 16), are provided on the lower portion of the through holes 15 in the sub-substrate 11, and a plurality of electrode pads 18 are mounded onto a main substrate 17 to correspond to the solder bump electrodes 16.

After electrical connection through the wire 14 (made from gold (Au), for example), is finished by mounting the semiconductor chip 12 onto the sub-substrate 11, a transfer molding is performed by means of EMC. The solder balls 16 are formed on a lower surface of the sub-substrate 11 having to correspond to the through holes 15, thereby obtaining the semiconductor device having solder bump electrodes 16 via a reflow soldering. This is the BGA package.

The BGA package constructed as above is mounted onto the main substrate 17, and the solder bump electrodes are electrically connected to respective electrode pads 18 on the main substrate 17 via reflow soldering, so that the assembly of the semiconductor device is completed.

The BGA package reduces the mounting area on the main substrate by approximately 30% compared with a quad flat package (QFP) which has the same pin count, but the BGA package described here is limited to mounting two-dimensional structures in which all connection terminals between the main substrate and package are positioned in the same plane.

Moreover, in the conventional BGA package, a resin encapsulation portion for protecting the semiconductor chip 12 from surrounding environment is formed on only one side at the interface of the package body 10 and subsubstrate 11. Also, the solder bump electrodes 16 formed under the sub-substrate 11 are reflow-soldered to the electrode pads 18 and have relatively weak structure. They are thus exposed to the external environment. Therefore, the internal and external environmental characteristics of the BGA package are resulting in worse than those of other packages in general use, thereby degraded performance thereof.

SUMMARY OF THE INVENTION

The present invention is devised to solve the above-described problems. Accordingly, it is an object of the present invention to provide a manufacturing method for making a semiconductor device having an external shape of a small outline J-leaded (SOJ) package, compatible with a currently-available mounting process to a main substrate, as well as to improve reliability.

It is another object of the present invention to provide a semiconductor device for improving mounting efficiency using a three-dimensional mounting structure that performs an interconnection between layers, using a BGA package able to be stacked on the inside of an SOJ package.

To achieve the above objects of the present invention, a method for manufacturing a semiconductor device is provided by forming through holes in the center of both ends of an upper surface and a lower surface of a main substrate, and plating copper (Cu), nickel (Ni), and gold (Au) sequentially, centering around the through holes to form a metal-coated layer.

Then, land patterns, connection leads and solder ball pads in a predetermined pattern configuration are provided around the metal-coated layer formed on the lower and upper surfaces of the main substrate via patterning. A semiconductor chip is mounted on the center of the main substrate using an adhesive. The chip is wire-bonded to the connection leads, and a package body is formed. Finally, solder balls of a predetermined shape are mounted onto the solder ball pads.

To achieve another object of the present invention, a semiconductor device according to the present invention includes a plurality of land patterns including through holes and connection leads formed on both ends of a lower surface of a main substrate, and a plurality of solder ball pads formed on both ends of an upper surface of the main substrate. In addition, a plurality of solder balls are formed onto the solder ball pads of the main substrate, and a semiconductor chip is mounted to the lower surface of the main substrate by interposing an adhesive and wire-bonding to the connection leads. A package body is provided by molding the semiconductor chip and wires with epoxy molding compound.

To achieve still another object of the present invention, a semiconductor device is provided which includes at least one semiconductor chip loaded on a lower surface of a printed circuit board, electrode terminals of the semiconductor chip wire-bonded to terminals on the printed circuit board, and a connection portion of the semiconductor chip and wires encapsulated by means of encapsulating resin. The semiconductor device has a three-dimensional structure, in which the printed circuit board is reversely mounted, the terminals of the printed circuit board are connected to external terminals via through holes, and at least one semiconductor device is stacked on an upper surface of the printed circuit board, so that respective semiconductor devices are interconnected by interposing solder balls to be mounted to other printed circuit boards by leads being the external terminals.

BRIEF DESCRIPTION OF THE DRAWINGS

The above objects and other advantages of the present invention will become more apparent by describing in detail preferred embodiments thereof with reference to the attached drawings, in which.

DETAILED DESCRIPTION OF THE INVENTION

Figure 1:
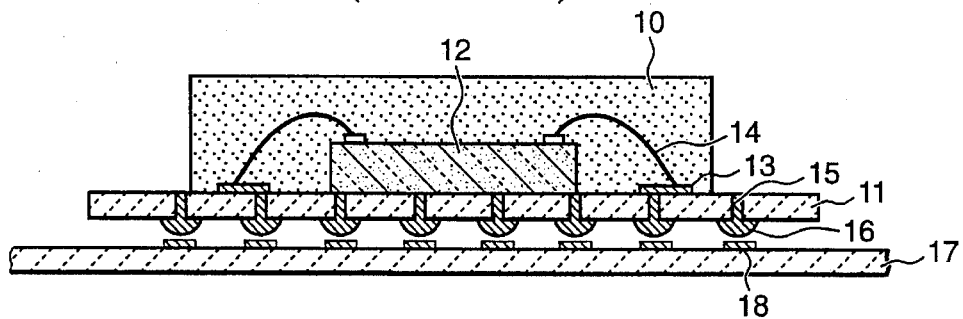
FIG. 1 is a vertical sectional view showing an example of a conventional semiconductor device.
Figure 2:
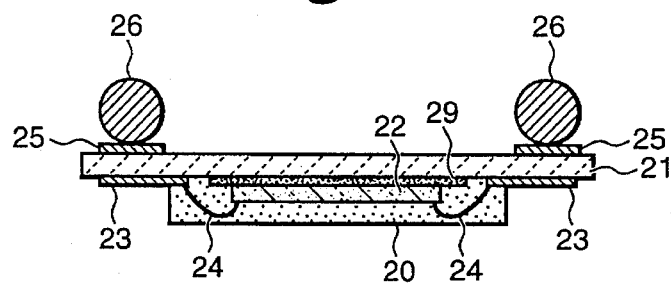
FIG. 2 is a vertical sectional view showing one embodiment of a semiconductor device according to the present invention.

Referring to FIG. 2, a preferred embodiment of a semiconductor device (SOJ package) according to the present invention will be described in detail.

In FIG. 2, a plurality of land patterns (not shown here) including through holes (not shown here) and connection leads 23 are formed on the lower surface of a main substrate 21. A plurality of solder ball pads 25 are formed on the upper surface of the main substrate 21, and a plurality of solder balls 26 are formed on the sold ball pads 25 of the main substrate 21.

A semiconductor chip 22 is mounted on the center, for example, of the lower surface of the main substrate 21 with an adhesive 29, and bonding pads (not shown) of the semiconductor chip 22 are bonded to the connection leads 23 via wires 24 and are molded with EMC to form a package body 20.

Here, the connection leads 23 electrically connect the through holes with the land patterns, and are electrically connected to the wires 24.

Figure 3:
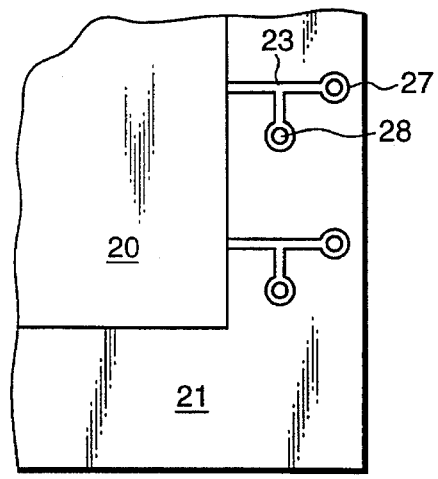
FIG. 3 is a partially cutaway plan view of FIG. 2 illustrating the land patterns, through holes, and connection leads, formed on the main substrate.

The above construction will be more clearly understood with reference to FIG. 3, which is a partially cutaway plan view of FIG. 2.

Referring to FIG. 3, the land pattern 27 and through hole 28 are formed in the lengthwise direction of the main substrate 21 to be commonly and electrically connected by the connection lead 23. The package body 20 is provided at the end of the connection lead 23 in the lengthwise direction.

Figure 4:
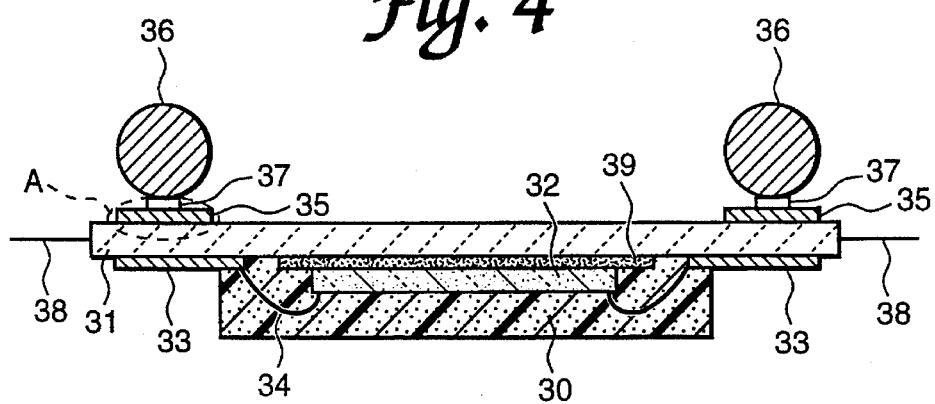
FIG. 4 is a vertical sectional view showing another embodiment of the semiconductor device according to the present invention.

FIG. 4 is a vertical sectional view showing another embodiment of the semiconductor device according to the present invention.

Referring to FIG. 4, the semiconductor device has at least one semiconductor chip 32 mounted on the lower surface of a printed circuit board (hereinafter referred to as "PCB") 31 by interposing an adhesive 39. Bonding pads (not shown) of the semiconductor chip 32 and electrode connection terminals 33 of the PCB 31 are bonded by means of wires 34. A connection portion of the semiconductor chip 32 and wire 34 are encapsulated with a resin to form a package body 30.

In the above-described semiconductor device, the PCB 31 is mounted upside down during a final mounting process, and the terminals of the PCB 31 are connected to external terminals via through holes. Also, at least one other semiconductor device is stacked on the upper surface of the PCB 31. In this case, the respective semiconductor devices are connected to each other by interposed solder balls 36, and mounted to other PCBs by means of leads 38, which function as the external terminals, resulting in as stacked semiconductor device having a three-dimensional structure.

When viewed from the reversed direction, a die pad portion of the semiconductor chip 32 on the upper surface of the PCB 31, a wire bonding pad portion for connecting the semiconductor chip 32 to the terminals of the package, and a solder bump pad portion formed of the solder balls 36 are plated with nickel (Ni) and gold (Au) to a thickness of 5 μm and 0.5 μm, respectively, using copper foil as a base, so that the device reliability is improved during the wire bonding.

Figure 5:
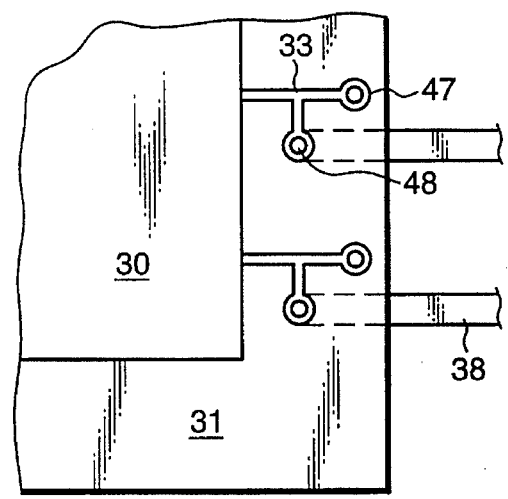
FIG. 5 is a partially cutaway plan view of FIG. 4 illustrating the land patterns, the through holes, and the connection leads formed on the main substrate.

The above-described construction will be more clearly understood with reference to FIG. 5 which is a partially cutaway plan view of FIG. 4.

Referring to FIG. 5, a land pattern 47 and a through hole 48 are formed in the lengthwise direction of the PCB 31, and are commonly and electrically connected by connection lead 33. The external terminal lead 38 is connected via the through hole 48. The package body 30 is provided on the end of the connection lead 33 in the lengthwise direction. The lead 38, which is the external terminal of the PCB 31, is plated with copper (Cu) or an alloy thereof.

Figure 6:
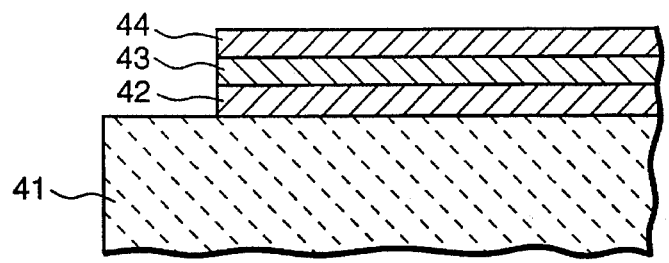
FIG. 6 is a sectional view in partial embodiment of A region of FIG. 4.

Meanwhile, referring to FIG. 6 (which is an enlarged, partial sectional view of region A FIG. 4), a solder ball pad 35 on which solder ball 36 is mounted is a metal-coated layer obtained by sequentially plating copper 42, nickel 43 and gold 44 on the PCB 41. A disc-shaped solder ball mounting portion 37 is provided on the upper portion of the thus metal-coated layer.

The PCB 41 is made of a thermostable material, such as bismaleimidetriazine (BT) resin and thermostable epoxy. The surface of the nickel plating is coated with gold (Au) 0.5 μm thick.

Figure 7:
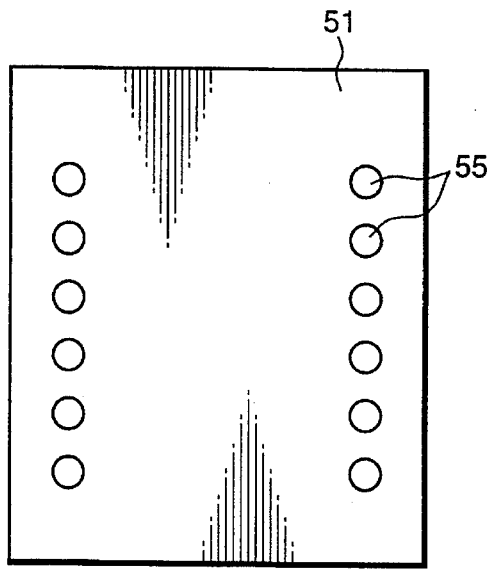
FIG. 7 is a plan view showing the upper surface of the semiconductor substrate in the semiconductor device according to the present invention.
Figure 8:
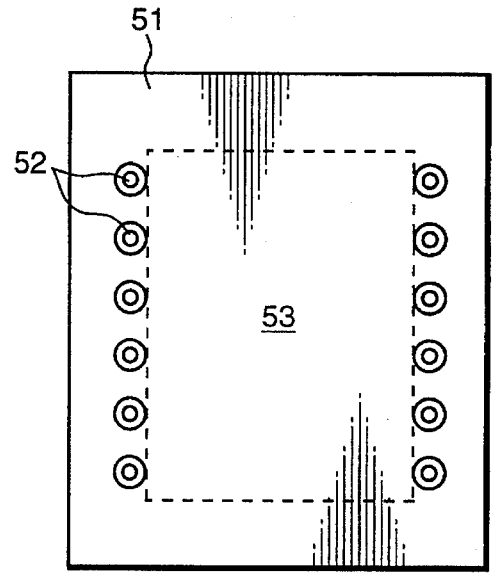
FIG. 8 is a plan view showing the lower surface of the semiconductor substrate in the semiconductor device according to the present invention, corresponding to FIG. 7.

FIGS. 7 and 8 are both plan views illustrating the upper and lower portions, respectively, of the semiconductor substrate used in the semiconductor device according to the present invention, prior to forming the land pattern.

Referring to FIG. 7, a disc-shaped terminal portion 55 is provided on an upper portion of a PCB 51 to allow another like PCB to be connected thereto by means of a respective solder ball.

Referring to FIG. 8, ring-shaped through holes 52 are formed to individually correspond to the disc-shaped terminal portions 55. The broken-lined region 53 on the center of the PCB 51 in FIG. 8 indicates a molding region where a molding body is generally formed.

Therefore, the upper/lower surfaces of the PCB 51 connected by the solder balls become conductive by means of the through holes or via holes, and an interlayer connection terminal (not shown) on the lower surface of the PCB 51 is electrically connected to the through hole 52. Also, a conductive portion and a through hole portion, except the portions which will be connected by means of the solder balls in succeeding processes, are coated with a solder-resist, respectively.

The above-described SOJ package may be manufactured in the following process, described by way of example with reference to FIGS. 4 to 8.

As shown in FIGS. 7 and 8, after a through hole 52 is formed in the center of both ends of the lower surface and upper surface of the main substrate 51, in which the through hole 52 in the lower surface is shaped as a ring to allow the external connection leads to be connected thereto, and the upper surface connected to the through hole 52 is provided as a disc form.

The land portion, including the through hole, is shaped as a ring by eliminating a conductive material portion from the center to facilitate alignment during stacking of the BGA packages. The land portion of the opposite side is shaped as a disc to prevent melted solder from flowing toward the opposite side during reflow soldering performed after mounting the solder ball.

Then, as shown in FIG. 6, copper (Cu), nickel (Ni) and gold (Au) are sequentially plated, centering around the through hole 52 via the plating process to form the metal-coated layer.

Thereafter, as shown in FIG. 4, the land pattern, connection lead and ball grid array are provided in a predetermined pattern configuration around the metal-coated layer formed on the lower and upper surfaces of the main substrate 31 via a patterning process, and the solder-resist is coated. Using an adhesive 39, the semiconductor chip 32 is mounted onto the center of the main substrate 31 and is bonded to the connection lead 33 by means of the wire 34, and the package body 30 is thereafter formed.

At this time, the semiconductor chip 32 is attached on the center of the main substrate 31 by using the conductive adhesive 39 on the die pad portion for attaching the semiconductor chip 32. The adhesive is then hardened at a temperature of approximately 150° C. Then, the bonding pads of the semiconductor chip 32 are connected to the external leads 38 of the main substrate 31 with a thin gold wire under a temperature of about 170° C. at a heater block.

Upon completing connection of the thin metal wire, the body molding is performed with the EMC. The solder ball mounting, in which the interlayer connection via the solder ball is accomplished by the land pattern, is then performed.

Thus, the manufacturing of the BGA package is completed by forming the solder ball 36 of a predetermined shape onto the solder ball pads 35 having through holes therein.

Figure 9:
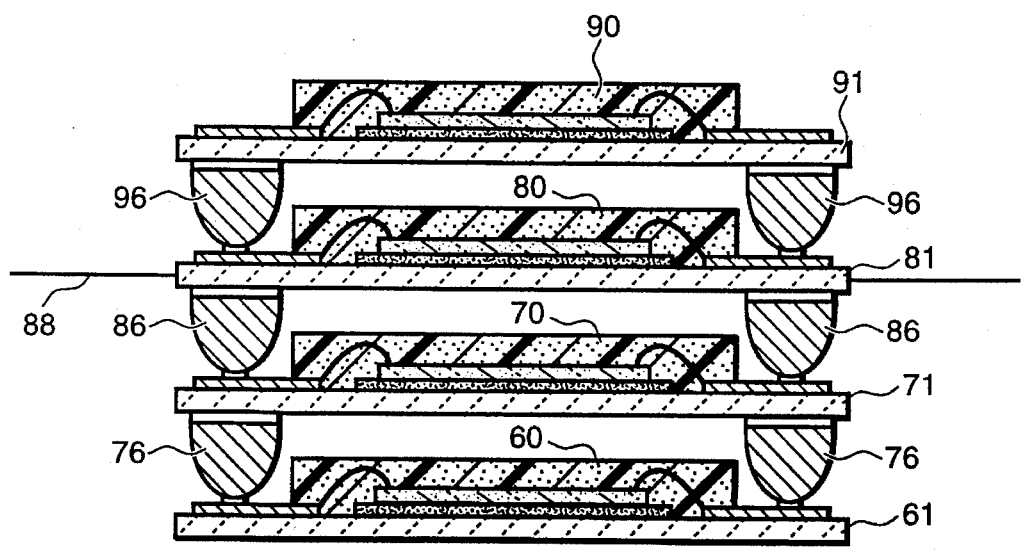
FIG. 9 is a vertical sectional view showing still another embodiment of the semiconductor device according to the present invention.

FIG. 9 is a vertical sectional view showing still another embodiment of the semiconductor device according to the present invention, which illustrates one preferred embodiment of the SOJ package mounted with the BGA package in a three-dimensional structure.

However, this BGA package has some disadvantages because of the different configuration of the land patterns between the upper and lower surfaces of the PCB. The terminals on both sides of the main substrate are thus connected via the through holes as shown in FIG. 5. In addition, by making the lower surface of the main substrate turn up after the molding, flux is coated over the land portion, and the solder balls are mounted on the land portion. Then, reflow soldering is carried out to form bumps, and respective packages, cut as a unit product, are employed.

In the semiconductor device illustrated in FIG. 9, a semiconductor chip is adhesively mounted onto the central surface of a main substrate 61 including through holes, connection leads and land patterns and the semiconductor chip is wire-bonded to the connection leads, so that a main package body 60 molded with the EMC is mounted in the opposite direction.

After this, a first semiconductor chip is adhesively mounted onto the center of the lower surface of a first substrate 71 including first through holes, first electrode connection terminals and first land patterns over the land pattern, and is wire-bonded to the first connection leads, so that a first package body 70 molded with EMC is mounted in the opposite direction, using first solder balls 76 as a connecting medium.

Then, a second semiconductor chip is adhesively mounted onto the center of the lower surface of a second substrate 81 including external leads 88, second through holes, second electrode connection terminals and second land patterns over the first land patterns and is then wire-bonded to the second connection leads, so that a second package body 80 molded with the EMC is mounted in the opposite direction, using second solder balls 86 as a connecting medium.

A third semiconductor chip is adhesively mounted onto the center of the lower surface of a third substrate 91 including third through holes, third electrode connection terminals and third land patterns over the second land pattern and is wire-bonded to the third electrode connection terminals, so that a third package body 90 molded with the EMC is mounted in the opposite direction, using third solder balls 96 as a connecting medium.

A stacked semiconductor device having a three-dimensional structure is therefore completed.

The semiconductor device having the three-dimensional structure constructed as above has external terminal leads 88 which are bent to be shaped as either "J-lead" or "gull-wing" for surface mounting onto a main substrate (not shown).

The external shape of the high-density, three-dimensional mounting package of the SOJ package. Internally, the BGA packages are stacked to realize the interlayer connection.

In other words, a substrate with leads and a substrate without leads are separately assembled to allow the upper surface having been molded to face upward, and the land portions that will be connected to solder bumps are coated with flux. The substrates are stacked, with the substrate with external leads generally in the center, and subjected to reflow soldering to achieve the interlayer connection. At this time, when applied to a memory device, the manufacturing process thereof is performed by designing signal lines in such a manner that common terminals are commonly connected and separately constructed terminals are connected by means of separate signal terminals.

Consequently, after reflow soldering, the memory device is molded with an encapsulation resin centering the substrate with external leads, hardened at a temperature around 175° C. for about 5 hours, and subjected to cutting and bending procedures to have a suitable lead shape required for the subsequent mounting thereof, thereby completing all processes.

The semiconductor device and manufacturing method thereof according to the present invention as described above can be usefully applied to the SOJ package capable of attaining the three-dimensional surface mounting, out of the scope of the conventional two-dimensional flat mounting of the BGA package.

Furthermore, the present invention is compatible with the currently-available mounting process on a main substrate and also improves reliability of the semiconductor device.

In addition, since the three-dimensional mounting structure for performing the interlayer connection using the BGA package, the mounting efficiency is improved to thus manufacture a semiconductor device that lowers manufacturing cost and enables mass production.

As a result, since the semiconductor device and manufacturing method therefor is achieved by the three-dimensional mounting structure which utilizes the BGA package capable of being stacked on the inside of SOJ package, it will be understood by those skilled in the art that various changes in form and details may be effected therein without departing from the spirit and scope of the invention as defined by the appended claims.

What is claimed is:

1. A semiconductor device comprising a stacked plurality of ball grid array (BGA) packages, each said BGA package comprising:

a circuit board having:
      a lower surface and an upper surface,
      a plurality of connection leads provided on said lower surface,
      a plurality of first and second land patterns electrically connected to respective said connection leads, and
      a plurality of solder ball pads provided on said upper surface and electrically connected to said first land patterns;

a semiconductor chip mounted on said lower surface of said circuit board;

a encapsulation resin portion covering at least said semiconductor chip; and a plurality of solder balls formed on said solder ball pads, wherein said plurality of BGA packages are stacked and interconnected by connecting said plurality of solder balls of a first said BGA package to respective said first land patterns of a second said BGA package, and wherein one of said stacked BGA packages has external leads electrically connected to respective said first and second land patterns.

2. A semiconductor device as claimed in claim 1, wherein said circuit board is formed by thermostable bismaleimide-triazine (BT) resin and thermostable epoxy, and is plated with gold (Au) to a thickness of approximately 0.5 µm.

3. A semiconductor device as claimed in claim 1, wherein said first land patterns are disc-shaped.

4. A semiconductor device as claimed in claim 1, wherein the upper and lower surfaces of said circuit board are electrically interconnected to each other by way of said through holes.

5. A semiconductor device as claimed in claim 1, wherein said circuit board is further provided with interlayer connection terminals on said lower surface of said circuit board and are electrically connected to said through holes, wherein a conductive portion and a through hole portion except the portions connected by said solder balls are coated with solder resist.

6. A semiconductor device as claimed in claim 1, wherein one of said BGA packages is provided with external leads plated with a copper-based material.

7. A semiconductor device as claimed in claim 6, wherein said plurality of solder balls and said external leads are formed on opposite sides of said circuit board.

8. A semiconductor device as claimed in claim 6, wherein said external leads are bent in a shape of "J".

9. A semiconductor device as claimed in claim 1, wherein said semiconductor chip is electrically connected to said plurality of connection leads by corresponding wires.

10. A semiconductor device as claimed in claim 9, wherein said encapsulation resin covers said semiconductor chip and said corresponding wires.

* * * * *